United States Patent [19]

Hutter

[11] Patent Number: 4,926,233

[45] Date of Patent: May 15, 1990

[54] MERGED TRENCH BIPOLAR-CMOS TRANSISTOR FABRICATION PROCESS

[75] Inventor: Louis N. Hutter, Richardson, Tex.

[73] Assignee: Texas Instruments Incorporated, Dallas, Tex.

[21] Appl. No.: 213,006

[22] Filed: Jun. 29, 1988

[51] Int. Cl.⁵ ............................................ H01L 27/02
[52] U.S. Cl. ......................................... 357/43; 357/55; 357/47
[58] Field of Search ....................... 357/42, 43, 35, 55, 357/67, 49, 47, 48

[56] References Cited

U.S. PATENT DOCUMENTS

| | | | |
|---|---|---|---|
| 4,528,047 | 7/1985 | Beyer et al. | 148/175 |
| 4,749,661 | 6/1988 | Bower | 357/34 |

FOREIGN PATENT DOCUMENTS 60-117664  6/1985  Japan ..................................... 357/34

OTHER PUBLICATIONS

"A Flat-Panel Display Control IC with 150-V Drivers", Masatoshi Kimura Takeaki Okabe, Isao Shimizu, Yasuo Nagai and Kazuo Hoya, IEEE Journal of Solid-State Circuits, vol. SC-21, No. 6, Dec., 1986, pp. 971-975.

"A New Isolation Technology for Bipolar Devices By Low Pressure selective Silicon Epitaxy", S. Hine, T. Hirao, S. Kayano, and N. Tsubouchi, LSI Research and Development Laboratory, Mitsubishi Electric Corp., Itami, Japan, pp. 116-117.

"Advanced Dielectric Isolation Through Selective Epitaxial Growth Techniques", John O. Borland, Clifford I. Drowley, Solid State Technology, Aug., 1985, pp. 141-148.

Primary Examiner—Andrew J. James
Assistant Examiner—Mark Prenty
Attorney, Agent, or Firm—B. Peter Barndt; James T. Comfort; Melvin Sharp

[57] ABSTRACT

A BICMOS fabrication technique utilizing trench depressions for forming bipolar and PMOS transistors. The trench depressions each have high conductivity diffusion sidewalls for functioning respectively as a collector conductor and a guard ring. The trench depressions include thin dielectric sidewalls for allowing small area transistors. NMOS devices are formed within the substrate material. The fabrication process allows a high degree of self-alignment and thus reduces numerous masking steps.

24 Claims, 8 Drawing Sheets

MERGED TRENCH BIPOLAR-CMOS TRANSISTOR FABRICATION PROCESS

RELATED APPLICATION

"TRENCH BIPOLAR TRANSISTOR", by Louis N. Hutter, filed concurrently herewith, Ser. No. 213212.

TECHNICAL FIELD OF THE INVENTION

The present invention relates in general to semiconductor fabrication techniques and resulting structures, and more particularly relates to the fabrication of trench-type bipolar and CMOS transistors and the resulting transistor devices.

BACKGROUND OF THE INVENTION

In the early development of integrate circuits, the trend was toward fabricating chips with finely delineated functions. For example, integrated circuit chips were readily available providing low level digital functions, while another class or family of integrated circuit chips were devoted to linear or analog functions to satisfy other applications. The design and fabrication technology evolved, and continues to do so by integrating high density and more complex digital and analog functions within the respective silicon chips. Not unsurprisingly, the industry demands for the integration of both digital and linear functions on a single chip has been recognized. For optimum electrical performance and efficiency of fabrication, the digital functions tend to be carried out by CMOS structures, while the analog functions tend to be designed around bipolar transistor circuits. The merging of bipolar and CMOS (BICMOS) transistor structures is disclosed in the co-pending application "Merged Bipolar/CMOS Technology Using Electrically Active Trench", by Louis Hutter, Ser. No. 945,796, filed Dec. 22, 1986 and now U.S. Pat. Ser. No. 4,819,052.

The merging of bipolar and CMOS transistor structures into a single integrated circuit process typically involves the addition of missing ingredients to an existing process technology. Conventionally, such integration is carried out by adding CMOS processing steps to an existing bipolar technology, and vice versa. Generally, the merging of such technologies results in an increase in the number of masking operations, as well as a non-optimized process, since the added transistor structures must be integrated into the existing chip fabrication process. It can be appreciated that in merging the bipolar and CMOS technologies in the noted manner, various compromises must be made which necessarily result in inefficient or extended processing, or a corresponding compromise in the device operation.

From the foregoing, it can be seen that a need exists for an improved BICMOS fabrication process which is efficient and easily implemented using current silicon processing equipment and techniques. A further need exists for an improved BICMOS fabricating process and resulting structure, wherein the device construction of the bipolar and CMOS devices is decoupled so that such components can be simultaneously and individually optimized. Yet another need exists for a BICMOS processing technique which minimizes the masking operations by optimizing the self-aligned steps and shared operations in fabricating both the bipolar and CMOS devices. An additional need exists for a BICMOS transistor structure wherein the bipolar devices can be fabricated in a smaller wafer area.

SUMMARY OF THE INVENTION

In accordance with the invention, there is provided a merged bipolar and CMOS transistor fabrication method and resulting structure which eliminates or substantially reduces the disadvantages and shortcomings of prior techniques and structures. According to an important technical advantage of the invention, each bipolar and PMOS transistor of the invention is enclosed within a dielectric cylinder in the substrate to provide a high degree of electrical isolation while yet conserving wafer area. Another important technical advantage of the invention is that a surface contact is made to a buried collector of the bipolar transistor by a vertical collector conductor which exhibits a uniform high conductivity, as measured in the vertical direction. As such, the vertical resistance or conductivity gradient is minimized, thereby lowering the series collector resistance. The PMOS transistor of the CMOS pair is also surrounded with a high conductivity guard ring which is fabricated at the same time and by the same techniques utilized in forming the high conductivity collector region of the bipolar transistor. The PMOS guard ring substantially reduces latchup.

In accordance with the preferred embodiment of the invention, trench depressions are formed in the face of a semiconductor substrate using a hard mask material. The trench depressions define the bipolar and PMOS transistor areas. The wafer is subjected to a diffusion, wherein the high conductivity regions are formed on the sidewalls and bottom of the trench depressions. The high conductivity trench bottom defines the buried collector of the bipolar transistor, while the high conductivity sidewalls of the trench define the vertical collector conductor thereof. Because the sidewalls of the trench depressions are simultaneously subjected to a lateral diffusion of impurities, a uniform doping profile is achieved vertically within the trench depression sidewalls. In addition, the vertical collector conductor entirely encircles the bipolar transistor to further reduce collector resistance. The similar high conductivity trench sidewalls and bottom of the PMOS transistor form a guard ring to reduce latchup with neighboring NMOS transistors formed directly within the substrate material.

A conformal layer of a dielectrical material is then deposited over the surfaces of the trench depressions, and anisotropically etched thereby leaving only sidewall deposits of the dielectric. The dielectric material on the bottom of the trench depressions is thus entirely removed, while the hard mask material yet covers the surface of the wafer. The sidewall deposits function to isolate a silicon transistor material subsequently formed within the trench, from the high conductivity sidewall diffusions located outside of the sidewall dielectric. Compact isolated transistor structures can thus be formed.

Next, the dielectric-lined trench depressions are filled with an epitaxially grown semiconductor material, using the silicon bottom surface of the trench depressions as the basis for the epitaxial growth. The epitaxial islands formed within the cylindrical dielectric shells comprise respectively N-wells for the PMOS transistor and semiconductor islands of bipolar transistor collector material. Selected areas of the P-type substrate are reserved as P-wells for forming therein the NMOS transistors. Subsequent diffusions are carried out to form source and drain regions in the NMOS and PMOS transistor areas, as well as semiconductor base and emitter regions in the bipolar transistor areas.

A significant technical advantage of the invention is that with the BICMOS transistor construction of the invention, much smaller area transistors can be efficiently fabricated using few masks than heretofore realized.

BRIEF DESCRIPTION OF THE DRAWINGS

Further features and advantages will become apparent from the following and more particular description of the preferred embodiment of the invention, as illustrated in the accompanying drawings in which like reference characters generally refer to the same parts or regions throughout the views, and in which.

DETAILED DESCRIPTION OF THE INVENTION

FIGS. 1–15 illustrate the major steps in fabricating the merged bipolar-CMOS integrated circuits of the invention. It is therefore understood that many other and additional and necessary steps may be included within the fabrication process to further refine or develop other structural aspects of the circuit. Also, the integrated circuit fabrication technique of the invention is described below in terms of basic fabrication parameters to form an NPN and a CMOS transistor pair having general operating characteristics. Those skilled in the art will readily realize that to emphasize certain transistor characteristic, the dimension, areas, doping levels or other types of impurities may be selected, adjusted or altered to achieve such special or refined characteristics.

Figure 1:
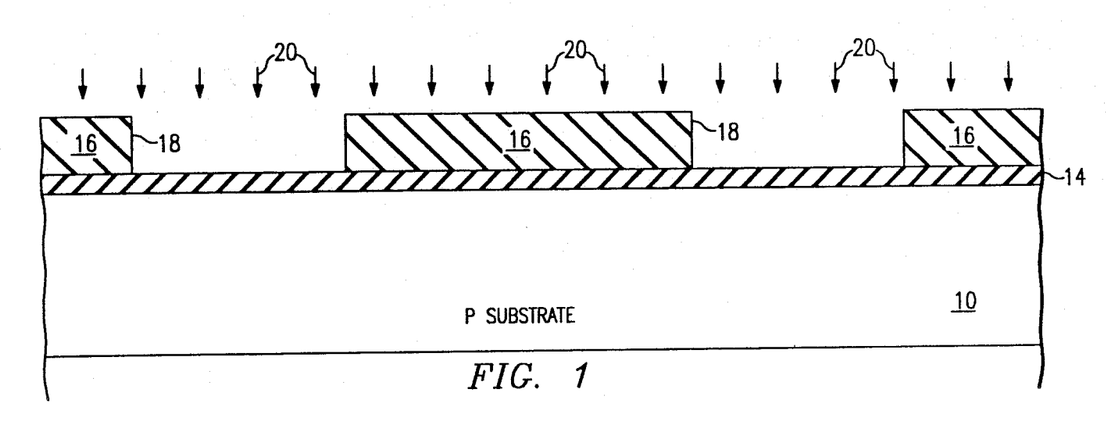
FIGS. 1–15 are sectional views of a semiconductor wafer illustrating the major sequential steps in fabricating the BICMOS transistor structure of the invention.

With reference now to FIG. 1, there is illustrated a P-type semiconductor substrate 10 forming the basis on which the integrated circuit of the invention is formed. The thickness of the substrate 10 is not shown to scale. Continuing with the fabrication process, a hard trench mask layer 14 of material is deposited over the surface of the substrate 10 to function as a mask for subsequent silicon etching processes. In the preferred form of the invention, a silicon dioxide (oxide) layer 14 is grown to a thickness of about one micron. Deposited silicon oxides can also be utilized for the hard mask 14. The hard mask layer 14 also functions as a sacrificial layer for the noted subsequent etching of the silicon substrate 10. In the alternative, the hard mask layer 14 can be a multiple layer structure, comprising oxide-nitride-oxide materials. Such a stacked construction is well known in the art, and can be easily integrated into the fabrication process of the invention.

A photoresist layer 16 is next spun or otherwise deposited over the surface of the wafer and patterned to define plural openings, such as indicated by the numeral 18, to locate trench depressions within the substrate 10. As will be explained more fully below, trench depressions are formed to define locations for bipolar transistors and PMOS transistors, while NMOS transistors are formed directly within the P-type substrate material 10. More particularly, the photoresist 16 is patterned to define areas for the removal of the hard mask layer portions 14. An oxide dry etch 20, preferably of the plasma type, is then conducted to effect a removal of the hard mask material 14 within the areas patterned by the photoresist 16.

Figure 2:
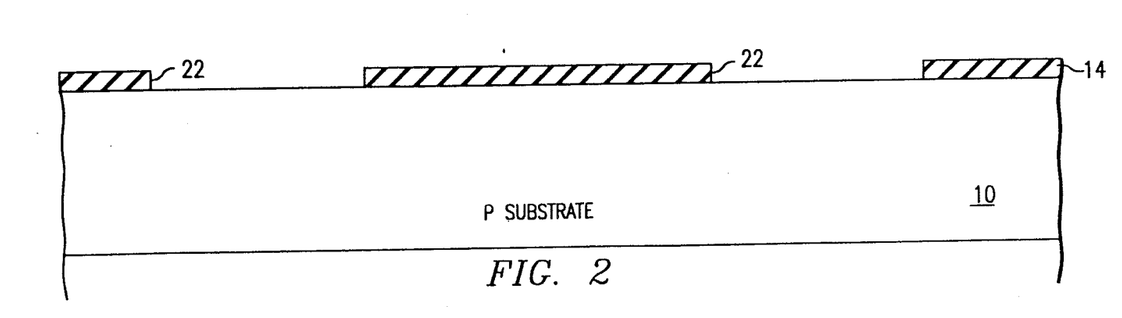

FIG. 2 illustrates the wafer after the patterning of the hard mask layer 14. The photoresist 16 is removed and the hard mask layer 14 then functions as a mask for the subsequent etching of the silicon substrate material 10. The openings 22 formed within the hard mask layer 14 may comprise a particular geometric shape to accommodate single bipolar and FET transistors, multiple bipolar or FET transistors, or multiple transistors and other passive elements such as semiconductor resistors. The openings 22 within the hard mask layer 14 may be as small as several microns for a single bipolar transistor of the invention, or may be up to two hundred microns, or more, to accommodate plural bipolar transistors and other semiconductor circuit components. The PMOS devices can be fabricated in much smaller wafer areas.

Figure 3:
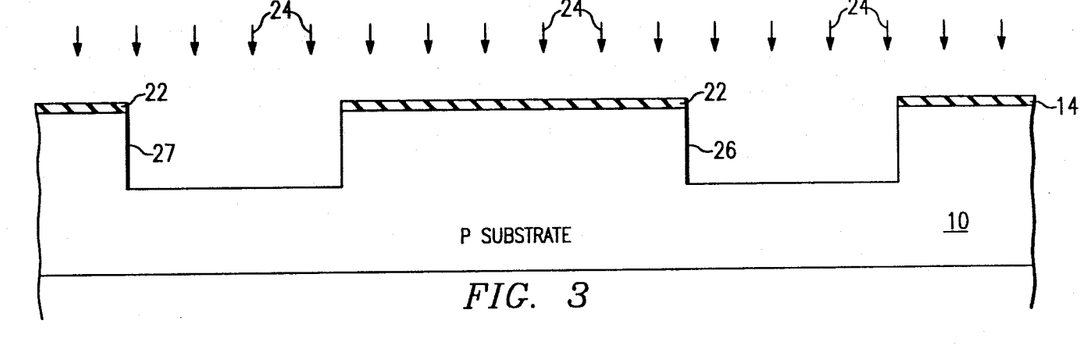

With reference now to FIG. 3, the wafer is shown after having undergone an anisotropic silicon etch 24. The anisotropic etch 24 effects a removal of the silicon material of the substrate 10, as defined by the patterned hard mask layer 14. Corresponding trench depressions 26 and 27 are formed. The thickness of the hard mask layer 14 is shown as being thinner than originally deposited. This is primarily due to the erosion and removal thereof during the dry anisotropic etch 24. Plasma etch chemistries are currently available for etching silicon material in the noted anisotropic manner.

The depth of the trench depressions 26 and 27 formed within the substrate 10 are generally a function of the breakdown voltage characteristics desired of the transistors to be formed at such locations. As noted above, the trench depressions 26 and 27 may be deeper for accommodating a thicker epitaxial layer to provide increased breakdown voltage characteristics of the bipolar transistors. For example, the fabrication of +5 volt bipolar devices normally used in digital applications may require a trench depression in range of 1–2 microns deep. For twenty volt bipolar devices normally used in linear applications, a trench depression of around eight microns thick may be required. For high voltage bipolar transistors which require a greater distance between the base-collector junction and the buried collector, the depth of the trench depression 26, and thus the epitaxial material filling, may be in the order of fifteen microns deep. Hence, the depth of the trench depression 26, which is easily controlled by the etch 24, can be utilized to define the $BV_{ceo}$ characteristics of the bipolar transistor formed therein. Since the PMOS transistors are surface operating devices, the depth of the trench 27 is of less significance.

Figure 4:
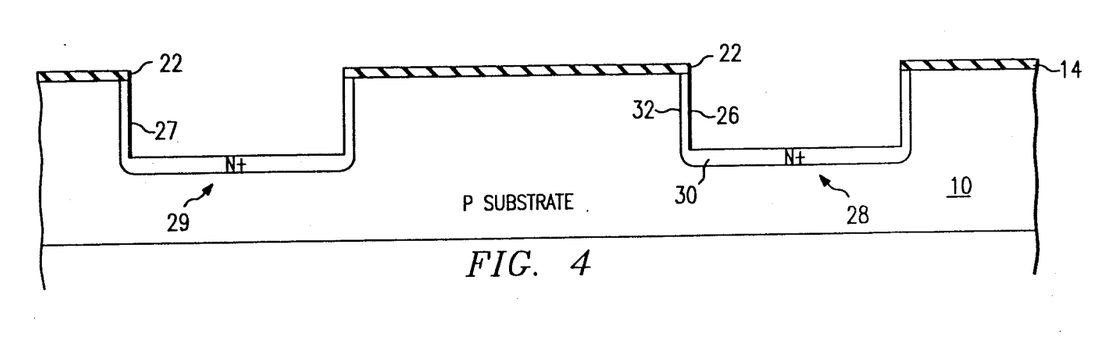

After forming the trench depressions 26 and 27, the wafer is subjected to a gaseous diffusion which is effective to diffuse N-type impurities into the surfaces of all of the trench depressions 26 and 27. FIG. 4 illustrates the heavily doped conductive structures 28 and 29 which are formed in all surfaces of the trench depressions 26 and 27 including sidewalls and bottom. The heavily doped region 30 formed at the bottom of the trench depression 26 defines a buried collector region of the bipolar transistor of the invention. Formed in electrical contact and continuous with the buried collector 30 is a vertical collector conductor 32 which is formed as a result of the lateral diffusion of impurities into the sidewalls of the trench depression 26. The vertical collector conductor 32 is self-aligned with the buried layer 30 without additional mask and patterning steps, as is necessary with standard buried collector (SBC) type of transistors. The heavily doped region 29 associated with the PMOS transistor site comprises a guard ring which is effective to reduce the backgate resistance and reduce latchup of PMOS and NMOS transistor pairs which form a CMOS device. As with the fabrication of the bipolar transistor structure, the guard ring 29 is formed at the same time as the collector structure 28, and is self-aligned in a similar manner. The highly conductive nature of the guard ring 29 presents a low resistance path for parasitic elements, thereby reducing the effects thereof.

In accordance with an important feature of the invention, the lateral diffusion of impurities into the sidewalls of the trench depression 26 provides substantially a uniform conductivity from the top of the vertical collector conductor 32 to the bottom thereof. Hence, with a uniform collector conductor conductivity, a reduced resistance gradient is formed therein, in contrast with the noted well known standard buried collector techniques. While there exists a lateral diffusion impurity gradient in the bipolar transistor collector conductor 32, such a gradient is of little consequence since collector current flows vertically therein. The lowest resistance area of the collector conductor 32 is near the surface of the sidewalls of the trench depression 26.

Dopant impurities having slow diffusing properties, such as antimony and arsenic may be utilized in forming the diffusion regions 28 and 29. While the diffusion regions 28 and 29 are described as being formed by a gaseous diffusion, new ion implanting techniques may be utilized for driving impurities uniformly into the sidewalls, as well as the bottom of the trench depressions 26 and 27. Current ion implant techniques are being developed for driving impurity ions at an angle into the sidewalls of trenches. Because the trench structures of the invention are relatively wide, the angular orientation of ion implanting equipment may be more easily utilized to form the vertical collector conductors 32.

In order to further reduce the collector resistance exhibited by the sidewall diffusion areas 28 and 29, a silicide process can be carried out at the wafer fabrication stage shown in FIG. 4. To form silicided sidewalls and bottom of the trench depressions 26 and 27, a refractory metal, such as tungsten, can be deposited over the surface of the wafer. Such a metal can be deposited using LPCVD techniques. Other refractory metals may be utilized with equal effectiveness. Next, the metal is reacted with the underlying silicon material by a conventional heat cycling step to form a low resistance silicide surface on the sidewalls and the bottom of the trench depressions 26 and 27. The sheet resistance of the silicided silicon material drops to about one ohm per square, thereby significantly reducing the transistor series collector resistance, as well as the guard ring resistance. An acid etch can be employed to remove any unreacted refractory metal. In order to enhance a selective epitaxial growth of silicon material within the trench depressions, an anisotropic etch can be utilized to remove some or all of the silicide material on the bottom of the trench depressions 26 and 27.

Figure 5:
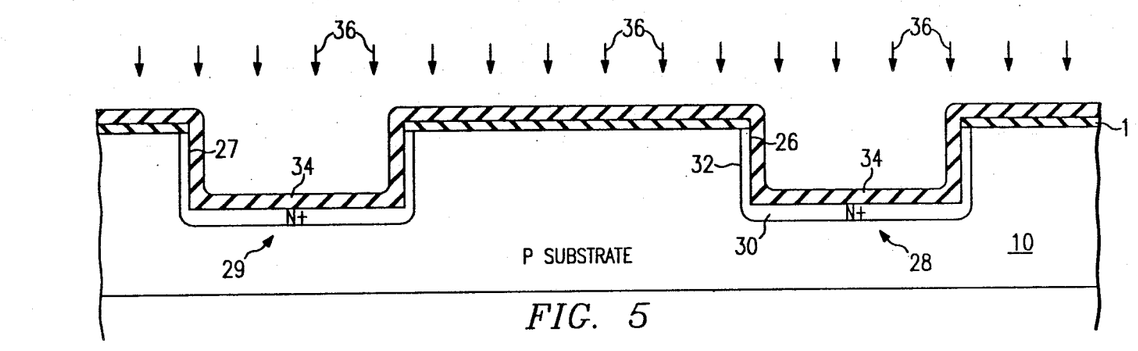

Referring now to FIG. 5, a conformal dielectric 34, such as silicon oxide, is shown deposited over the surface of the wafer, including the trench depressions 26 and 27. A low pressure chemical vapor deposition (LCPVD) type of oxide is preferably utilized, and may be of the type commonly identified as TEOS. The thickness of the conformal dielectric 34 may be anywhere from 1000 angstroms to 1 micron, or other depth to suit particular purposes. As noted in FIG. 5, the composite layered construction, including the hard mask layer 14 and the conformal material 34 is of increased depth on lateral wafer areas comprising the top surface of the substrate 10.

Figure 6:
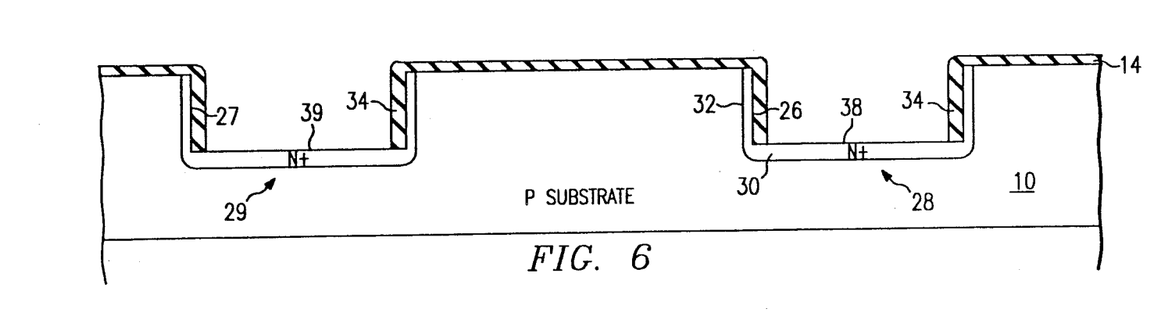

The wafer is then subjected to a dry etch 36 of the anisotropic type for uniformly removing the conformal material 34 uniformly in a vertical direction. Plasma etches are well suited for this type of etch. The anisotropic etch 36 is continued until the conformal material 34 deposited on the bottom surface of the trench depressions 26 and 27 are entirely removed, thereby leaving a cylindrical sidewall dielectric, as shown in FIG. 6. The surface coating of the hard mask material 14 remains on the surface of the wafer. With such an etching technique, the entire surface of the wafer remains covered with either the hard mask layer 14 or the sidewall dielectric 34, except for the bottoms 38 and 39 of the respective trench depressions 26 and 27. Importantly, the only silicon material exposed comprises that on the bottoms 38 and 39 of the trench depressions 26 and 27. As such, no additional masking steps are required to selectively form the silicon material 40 at the desired areas.

Figure 7:
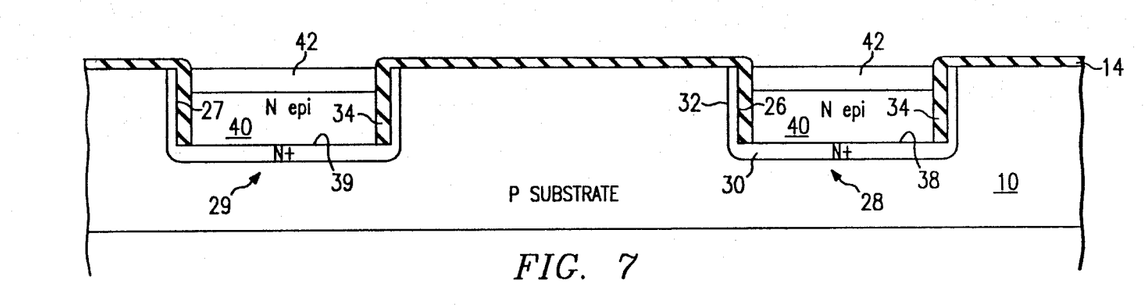

The dielectric lined trench depressions 26 and 27 are next filled with a single crystal lightly doped N-type semiconductor material, as shown by FIG. 7. The trench depression filling operation is carried out utilizing a selective epitaxial growth technique, such as the type described in either of the technical articles "A New Isolation Technology For Bipolar Devices By Low Pressure Selective Silicon Epitaxy", by Hine et al., VLSI Symposium Tech. Digest, pp. 116–117, 1982; or "Advanced Dielectric Isolation Through Selective Epitaxial Growth Techniques", by Borland et al., Solid State Technology, August, 1985, the disclosures of such articles being incorporated herein by reference. According to such silicon growth process, the epitaxial semiconductor material 40 is deposited or grown only at those locations having exposed or virgin single crystal silicon material, such as the bottoms 38 and 39 of the dielectric lined trench depressions 26 and 27. The epitaxial semiconductor material 40 does not nucleate, or grow, at non-silicon locations, such as on the silicon oxide layer 14. The epitaxial growth process is effective to form the single crystal semiconductor material 40 to form defined thickness as a function of time. Such process is carried out for a period of time sufficient to generally fill the dielectric lined trench depressions 26 and 27.

As noted in FIG. 7, the dielectric lined trench depressions 26 and 27 are shown filled with the epitaxial semiconductor material 40, preferably to a depth such that the top surface thereof is generally level with the surface of the substrate 10. If desired, the wafer can be subjected to an ion implant, wherein donor atoms can be driven into the silicon surface to form an Nwell 42 in the N-epi areas. A dosage of about $10^{12}$ atoms per $cm^2$ of phosphorus or arsenic is effective to accomplish the surface impurity concentration. The dopant impurities raise the doping level in the PMOS transistor sites thereby reducing short-channel PMOS problems such as punchthrough, breakdown and threshold voltage roll-off. As an alternative, and during the later stages of the epitaxial growth process, the donor impurity may be introduced into the reaction chamber so that the surface concentration of donor atoms is formed. Since this Nwell 42 resides near the surface of the silicon, the performance and breakdown voltage (BVceo) of the bipolar NPN transistor are unaffected. This implant can be masked from bipolar regions, if desired, through the use of a photoresist masking process.

At this juncture of the semiconductor fabrication process, the wafer can be planarized to remove the surface portions of the silicon oxide 14 in preparation for forming the BICMOS transistor devices of the invention and other devices within the epitaxial material 40. Conventional planarizing steps can be utilized, as is well known in the art, followed by a new oxide layer which is patterned to define the components to be formed within the epitaxial material 40. In the example, only a single bipolar transistor and CMOS transistor are formed within the respective silicon islands, and thus the planarization and reoxidation steps are not utilized.

Figure 8:
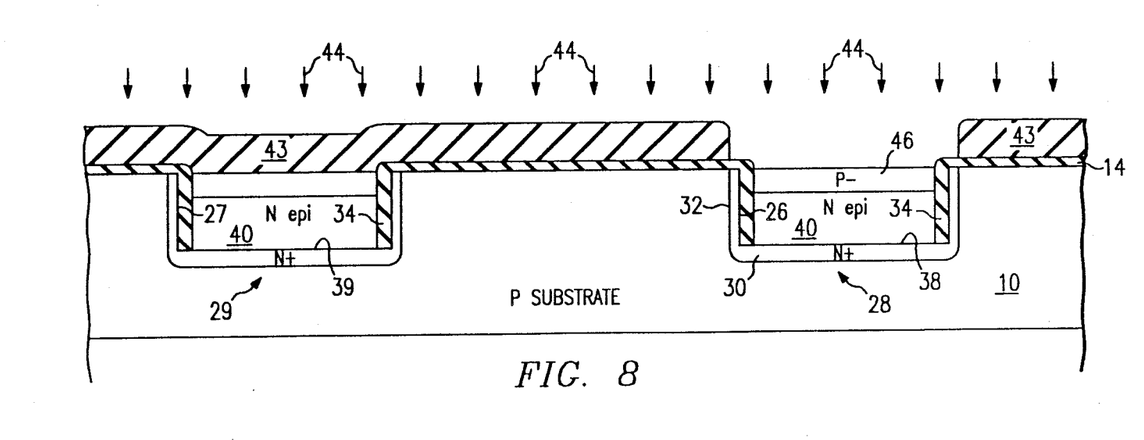

FIG. 8 illustrates the results of a photoresist 43 mask and patterning step, or other maskable material, is utilized to form P-type semiconductor base regions in the bipolar transistor sites. In the preferred form of the invention, the entire top surface of the epitaxial material 40 in the bipolar transistor sites has been opened for forming therein the P-type semiconductor base regions. While not shown, other surface areas of the substrate 10 may be opened to form substrate connections, if the doping level used for the base regions is sufficiently high. For optimum speed, the bipolar transistor base region is lightly doped, and thus only the bipolar transistor sites are opened. When fabricating bipolar transistors with heavily doped base regions, the wafer can be patterned to simultaneously form substrate connections, as well as NMOS source and drain regions. The NMOS transistor site is shown situated between the bipolar and PMOS transistor sites.

As noted above, masking of the epitaxial material 40 in the bipolar transistor sites may be advantageously utilized for fabricating semiconductor resistors and lateral PNP bipolar transistors therein. The wafer is then subjected to a diffusion process 44, in which P-type impurities are diffused into the exposed areas of the bipolar transistor epitaxial material 40, as well as any other opened areas of the substrate 10. In the alternative, an ion implant process can be utilized to construct the P-type semiconductor base regions. Formed within the patterned semiconductor surfaces is a lightly doped P-type semiconductor region 46 defining a base region of the high-speed NPN transistor of the BICMOS structure. Significantly, the base region 46 is formed generally self-aligned according to the hard mask 14. The semiconductor base region 46 may be formed with a thickness depending on the type of transistor and the electrical characteristics thereof desired. For high speed bipolar transistors, the base thickness of region 46 may be about 1.5 microns or shallower. For linear applications, semiconductor base region 46 may be constructed with a depth in the range of 2.5 to 3 microns. The doping level of the base region 46 can also be selected to suit particular needs, but is shown as a doped region with a surface concentration of about $10^{19}$ atoms per cm$^3$. Those skilled in the art may prefer to form the base region 46 having a more lightly or heavily doped impurity concentration to improve certain performance characteristics of the bipolar transistor. The diffusion 44 of the P-type impurities into the epitaxial material 40 overwhelms the unmasked areas of Nwell 42 impurities, such as in the unmasked bipolar transistor areas. However, in the portions of the epitaxial material 40 which remain masked, where masking is utilized, the impurities of the Nwell 42 remain effective to improve the PMOS short-channel effects.

It should be noted that since, generally, the only devices built directly in the P-substrate 10 are the NMOS transistors, the doping level of the substrate can be raised to reduce short-channel problems with such NMOS devices. It is a technical advantage of this invention that the N-type epitaxial material 40 which forms the basis for both bipolar and PMOS devices is totally independent of the substrate 10 and does not employ counter-doping techniques which necessitate that all subsequent wells must be more heavily doped than the beginning substrate doping level. This is especially advantageous in fabricating integrated CMOS processors.

Figure 9:
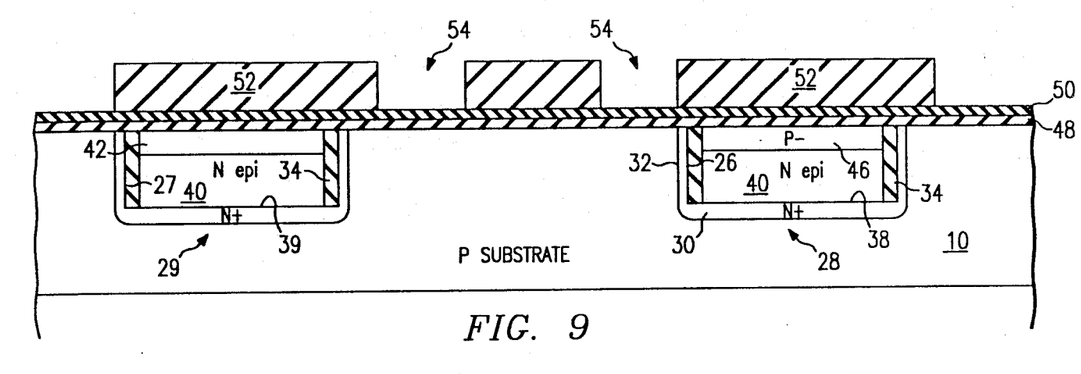

FIG. 9 depicts the wafer after removal of the surface deposits of the hard mask layer 14 and the subsequent depositing of material layers. More specifically, a pad silicon oxide 48 is formed over the surface of the wafer to a nominal depth of about 500 angstroms. The pad oxide 48 can be either deposited or grown to the desired depth. Next, an LPCVD silicon nitride layer 50 is deposited over the pad oxide 48 to a nominal depth of about 1,000 angstroms. The nitride layer 50 functions as a silicon oxidation mask for forming field oxide areas. A photoresist 52 is spun oVer the wafer and patterned to define openings 54 for forming thick field oxide insulation areas. The silicon nitride 50 is selectively removed by a suitable etching process in the patterned areas. This is illustrated in FIG. 10.

Figure 10:
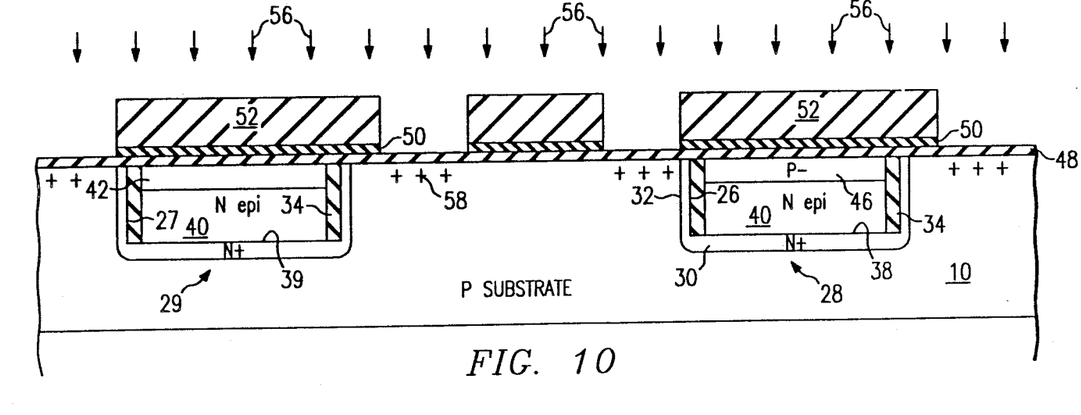

FIG. 10 further shows an ion implant 56 which is effective to drive a P-type impurities 58 into the patterned areas of the substrate 10. The impurities may comprise boron which are driven through the thin silicon and oxide 48. The boron impurities comprise a channel stop which will later underlie the thick field oxide regions.

While FIG. 9 shows the photoresist regions 52 covering the entire trench transistor regions, it should be understood that when multiple devices are built within one N-epitaxial island there may be many small photoresist regions patterned over each such island. This is generally the case for PMOS transistors, where many such devices share a common backgate region. In these cases, there may be a need to provide isolation between adjacent PMOS devices, such as was achieved for the NMOS device areas in FIG. 10. For this situation, a second layer of photoresist (not shown) can be patterned on the wafer shown in FIG. 10, with the first photoresist 52 remaining in place and self-aligned to the underlying nitride layer 50. This second layer of photoresist covers all areas except for the N-epitaxial regions. A phosphorus or arsenic n-type implant can then be performed which will function as a channel stop once the thick field oxide is grown.

Semiconductor resistors made from the base diffusion can also be formed in the epitaxial material 40 and yet be isolated by the above phosphorus channel stop. This channel stop prevents the operation of parasitic MOS devices which could otherwise be effective to short-circuit the various components formed within the epitaxial material 40.

Figure 11:
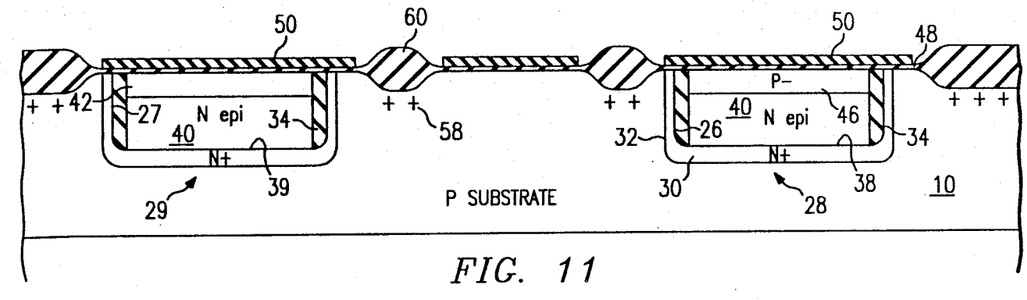

With reference now to FIG. 11, the wafer is shown with the photoresist 53 stripped from the wafer. The wafer is then subjected to a silicon oxidizing environment, in which a thick silicon field oxide 60 is grown in those areas not masked by the patterned silicon nitride layer 50. As can be seen, the thick field oxide 60 serves to electrically isolate the various transistor sites formed within the sidewall isolated epitaxial areas 40, as well as the NMOS transistor sites, shown intermediate in the FIGURE. The silicon pad oxide layer 48 and nitride layer 50 are then stripped from the surface of the wafer.

Figure 12:
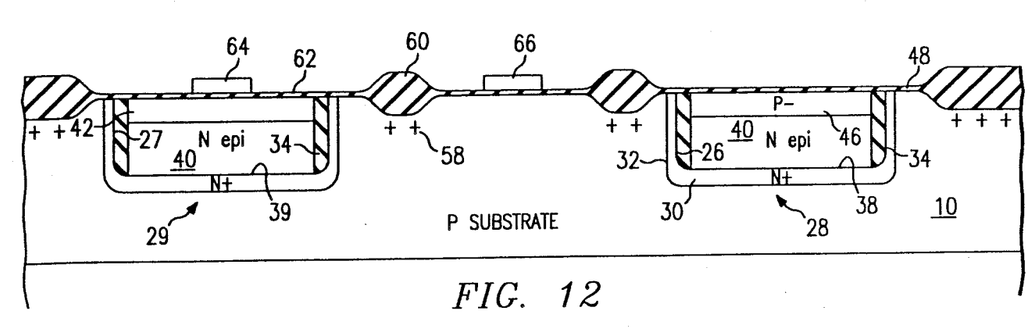

FIG. 12 illustrates the result of a semiconductor processing step in which a thin gate oxide 62 has been grown over the surface of the wafer. The gate oxide 62 functions as a gate insulator for the PMOS and NMOS transistor deVices. Next, a doped or conductive polycrystalline silicon (polysilicon) is deposited over the wafer and patterned to define a gate conductor 64 for a PMOS transistor and a gate conductor 66 for an NMOS transistor.

Figure 13:
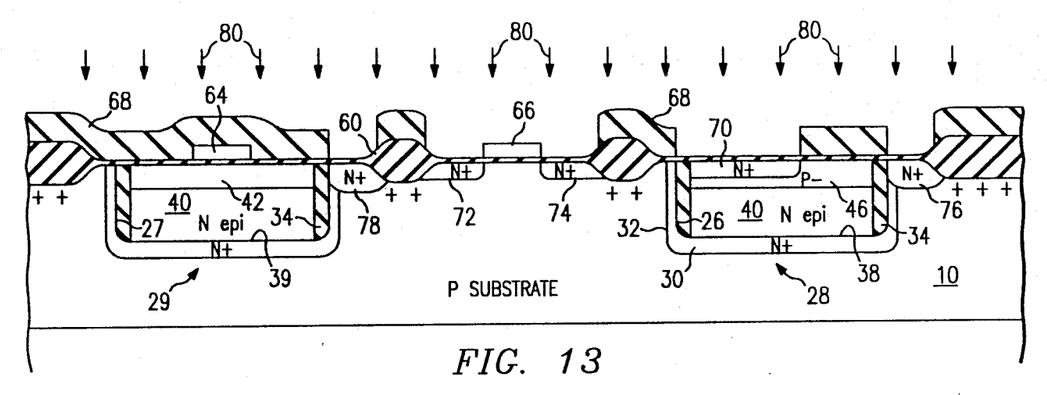

The wafer then undergoes a diffusion process for forming N-type semiconductor regions on surface areas of the wafer. As illustrated in FIG. 13, the wafer is covered with a maskable material, and masked and patterned to define those areas for forming heavily doped N-type semiconductor regions. Particularly, the wafer is masked with a photoresist 68 to define a semiconductor emitter region 70 of the bipolar transistor. The emitter region 70 is formed within the semiconductor base region 46. N-type source and drain regions 72 and 74 are also defined in the photoresist 68 in connection with the NMOS transistor which is formed within the P-type semiconductor material of the substrate 10. In addition, N-type semiconductor regions 76 and 78 are formed in the substrate 10 in electrical contact respectively with the vertical collector conductor 32, and the guard ring 29 associated with the PMOS transistor. The heavily doped N-type semiconductor region 76 is effective to make contact to the collector of the bipolar transistor of the BICMOS circuit.

After patterning the photoresist 68 as noted, the wafer is implanted 80 with impurity ions to form the respective N-type semiconductor regions. The impurity concentration of the emitter 70 predominates and can be chosen by those skilled in the art to satisfy particular operating constraints or parameters of the bipolar transistor of the invention.

Figure 14:
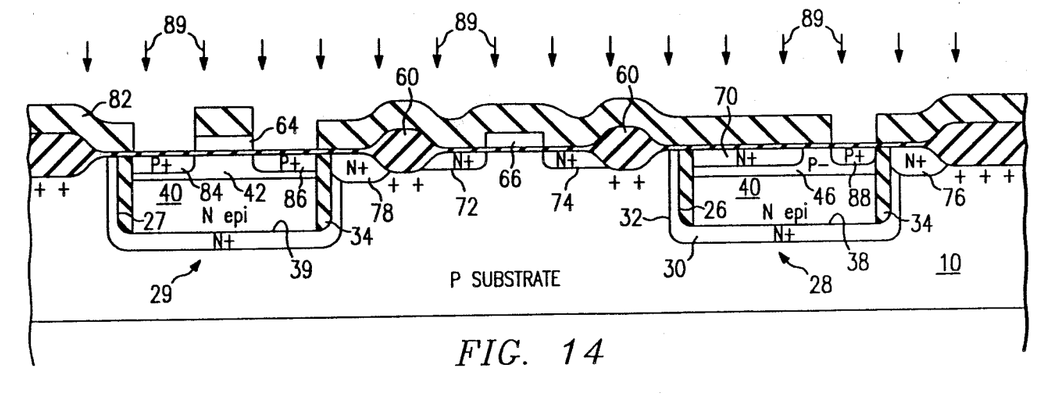

FIG. 14 shows the semiconductor structure of the invention after patterning another photoresist layer 82 to define locations for forming P-type semiconductor regions. Areas in the photoresist 82 are opened to form P-type source and drain regions 84 and 86 in the PMOS transistor site, as well as a contact area 88 to the bipolar transistor base region 46. The noted P-type regions are normally heavily doped by an implant or diffusion 89, and thus formed as a separate step from the formation of lightly doped P-type bipolar base region 46. As noted, the PMOS source and drain regions 84 and 86 are self aligned with the gate conductor 64.

Figure 15:
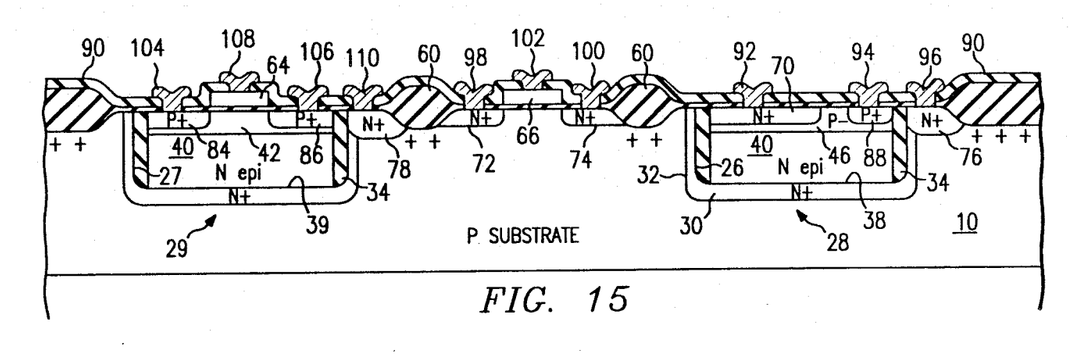

FIG. 15 illustrates the completed integrated BICMOS circuit of the invention, including metal contacts to the various semiconductor regions. The surface of the wafer is covered with a dielectric or other electrical insulating material, such as shown by reference character 90. The insulator 90 is patterned to define openings to the various semiconductor regions. Next, and in accordance with conventional interconnect metallization processes, a layer of conducting material, such as aluminum, is deposited over the surface of the wafer and masked and patterned to define the various conductors and interconnect patterns. An emitter contact 92 provides an electrical connection to the semiconductor emitter region 70 of the bipolar transistor. Another contact 94 is formed over the epitaxial material 40 for providing contact to the semiconductor base region 46 of the bipolar transistor. An off-site collector contact 96 is formed in electrical contact with the heavily doped surface semiconductor region 76 for providing electrical continuity to the buried collector layer 30, via the vertical collector conductor 32. Because the vertical collector conductor 32 circumscribes the epitaxial material 40, additional collector contacts 96 and corresponding regions 76 can be formed around the bipolar transistor to provide reduced collector resistance.

With regard to the NMOS transistor, metal contacts 98 and 100 provide electrical connections to the source and drain regions 72 and 74. Contact 102 is electrically connected to the gate conductor 66 of the NMOS transistor. In like manner, contacts 104 and 106 provide electrical access to the source 84 and drain 86 of the PMOS transistor. Contact 108 is connected to the gate conductor 64 to control conduction of the PMOS transistor. Contact 110 enables contact to be made to the guard ring 29 for biasing the back gate semiconductor region of the PMOS transistor.

The bipolar transistor construction described above is particularly well suited for fabrication of lateral PNP devices. While not shown, a lateral PNP device can be formed in the epitaxial material 40 of the bipolar transistor site without encompassing additional masking or diffusion steps. A lateral PNP bipolar transistor formed in the epitaxial material 40 avoids undesired substrate currents which are a common problem in lateral PNP devices otherwise fabricated with SBC techniques. In such well known PNP transistor constructions, parasitic bipolar transistors provided parallel paths for collector current which give rise to the undesired substrate currents. Such currents are undesirable as they can cause latchup and other problems. In accordance with a lateral PNP transistor of the invention, the parasitic transistor gain in a lateral direction is substantially reduced by the sidewall dielectric 34 of the associated trench depression. In like manner, the parasitic transistor gain in a vertical direction is substantially reduced by the highly conductive region 30 at the bottom of the trench depression 26. Hence, lateral PNP devices formed in the epitaxial material 40 provide optimal operation in that substrate currents are reduced.

Figure 16:
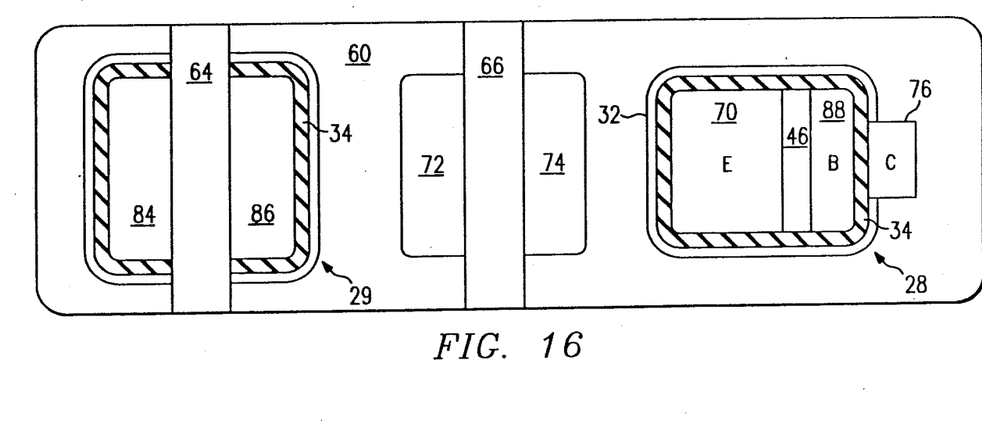
FIG. 16 is a top sectional view of the transistor structure of FIG. 15.

FIG. 16 illustrates a top generalized sectional view of the BICMOS structure of FIG. 15. As noted, the BICMOS circuit fabricated in accordance with the invention requires reduced wafer area, as the isolation dielectric 34 is not subjected to lateral spreading during wafer processing, as is the case with conventional diffusion isolation regions. Indeed, the isolation dielectric thickness is independent of the depth to which it is formed within the substrate 10, and thus the lateral area required by the bipolar transistor is not a function of the depth of the epitaxial material 40. Another technical advantage of the invention is that by processing the semiconductor materials according to the foregoing, it is possible to self-align five regions, comprising the N+ buried collector 30, the deep N+ collector conductor 32, the P-isolation region, the N-well 40 or N-type epitaxial region of the PMOS transistor, and the semiconductor base region 46 of the bipolar transistor. The corresponding masking steps are also reduced over prior well-known BICMOS fabrication techniques. An important technical advantage of the invention is that CMOS latchup is greatly reduced through the use of a total N+ ring around and under the PMOS transistor. The oxide isolation sidewall of the PMOS transistor also prevents latchup by reducing the conductivity between the PMOS and NMOS devices. The foregoing technique also provides a process for allowing flexibility in independently optimizing the bipolar and CMOS components. Such flexibility includes the option for selecting choices for the P-well and N-well doping levels to optimize the performance of both the PMOS and NMOS devices. Another technical advantage of the invention is that a wider variety of bipolar devices can be fabricated and merged with CMOS processing so that combined digital and analog functions can be efficiently realized. With low resistance collector characteristics, power bipolar devices can be formed in the noted merged process.

While the preferred and other embodiments of the invention have been described with reference to specific fabrication techniques and resulting structures, it is to be understood that many changes in detail may be made as a matter of engineering choices, without departing from the spirit and scope of the invention as defined by the appended claims.

WHAT IS CLAIMED IS:

1. A transistor structure, comprising:
   a pair of trench depressions formed in a semiconductor substrate;
   a heavily doped layer of semiconductor material forming a shell around each said trench depression;
   an insulating layer formed on sidewalls of each said trench depression, a bottom portion of said trench depressions being defined by said heavily doped layer;
   a semiconductor material formed in a lower portion of each said trench depression;
   a bipolar transistor formed within said semiconductor material of one said trench depression; and
   a FET transistor formed within said semiconductor material of the other said trench depression.

2. The transistor structure of claim 1, further including a heavily doped contact region formed outside said insulating layer of each said trench depression, and formed in said substrate and in contact with said heavily doped layer.

3. The transistor structure of claim 1, wherein said bipolar transistor is formed in an area of said substrate comprising no more than about thirty square microns.

4. The transistor structure of claim 1, further including an NMOS transistor formed within said substrate, and connected to said FET to form a CMOS transistor pair.

5. The transistor structure of claim 1, further including an NPN transistor formed within the semiconductor material of one said trench depression.

6. The transistor structure of claim 1, further including a lateral PNP transistor formed within the semiconductor material of one said trench depression.

7. The transistor structure of claim 1, further including a low resistance silicide surface in between the heavily doped layer of semiconductive material forming the sidewalls of said trench depressions and said insulating layer.

8. The transistor structure of claim 1, wherein said semiconductor material has a doping concentration less than that of said semiconductor substrate.

9. A transistor structure adapted for improved electrical operation, comprising:
   a pair of trench depressions formed in a semiconductor substrate;
   a heavily doped semiconductor region formed in the sidewalls of each said trench depression, each said heavily doped region having a substantially uniform vertical doping profile so that incremental resistance changes thereof as measured in a vertical direction are substantially uniform;
   a semiconductor collector material formed within one said trench depression;
   a semiconductor base region formed within said collector material;
   a semiconductor emitter region formed within said base region to define a bipolar transistor;
   a semiconductor material well formed within the other trench depression;
   a semiconductor source and drain region formed in said semiconductor material well; and
   a gate insulator and gate conductor formed over said semiconductor material well for defining a field effect transistor.

10. The transistor structure of claim 9, further including an insulating layer defining a sidewall dielectric on each said trench depression.

11. The transistor semiconductor structure or claim 9, wherein said heavily doped region is constructed so as to form a shell of heavily doped material on the sidewalls and bottom of said trench depression associated with said bipolar transistor.

12. The transistor structure of claim 11, further including a dielectric formed only on the sidewalls of each said trench depression.

13. The transistor structure of claim 9, further including a semiconductor resistor formed within said base region, and further including a channel stop providing surface isolation to said resistor.

14. The transistor structure of claim 9, wherein said collector material and said material well comprise an epitaxial semiconductor material which is laterally isolated from said substrate by an insulating dielectric layer.

15. The transistor structure of claim 14, wherein said insulating layer is cylindrical shaped.

16. The transistor structure of claim 9, further including an NMOS transistor formed in said substrate and connected to said field effect transistor to define a CMOS device.

17. The transistor structure of claim 9, further including a low resistance silicide surface on the heavily doped semiconductor regions formed in the sidewalls of each said trench depression.

18. The transistor structure of claim 9, wherein said semiconductor collector material and said semiconductor material well have a doping concentration less than that of said semiconductor substrate.

19. A BICMOS transistor structure, comprising
   a semiconductor substrate having a pair of trench depressions formed therein;
   a heavily doped region in the sidewalls and bottom of each said trench depression to provide a low resistance trench depression surface;
   an insulating dielectric formed on the sidewalls of each said trench depression surface to provide lateral isolation;
   an epitaxial semiconductor material formed within each said dielectric lined trench depression; a bipolar transistor formed within the epitaxial material of one said trench depression;

a MOS transistor of one type adapted for forming a CMOS device formed within the epitaxial material of the other trench depression;

a MOS transistor of another type adapted for forming the CMOS device formed within said substrate; and conductors connecting both said MOS transistors to form said CMOS device.

20. The BICMOS transistor of claim 19, further including a low resistance silicide surface formed in between the heavily doped region in each sidewall of said trench depressions and said insulating dielectric.

21. The BICMOS transistor of claim 19, wherein said heavily doped region comprises a diffused region with substantially a uniform doping profile along said trench depression sidewalls and bottoms.

22. The BICMOS transistor of claim 19, wherein said epitaxial semiconductor material has a doping concentration less than that of said semiconductor substrate.

23. A bipolar and a PMOS transistor structure comprising:

a pair of trench depressions formed in a semiconductor substrate;

a heavily doped layer of semiconductor material formed as a shell around each of said trench depression;

an insulating layer formed on the sidewalls of each said trench depression, a bottom portion of each said trench depression being defined by said heavily doped layer;

a semiconductor material well formed in a lower portion of each said trench depression;

a bipolar transistor formed in the semiconductor material well of one said trench depression; and a PMOS field effect transistor device formed in the semiconductor material of the other said trench depression.

24. The bipolar and PMOS transistor structure of claim 23, wherein the bipolar transistor is a lateral PNP bipolar transistor.

* * * * *